June 30, 1970 A. H. JOHNSON ET AL 3,517,438

METHOD OF PACKAGING A CIRCUIT MODULE AND JOINING SAME TO A CIRCUIT SUBSTRATE

Filed May 12, 1966

INVENTORS

ALFRED H. JOHNSON

WILLIAM R. McCONNELL

BY Donald L. Campbell

ATTORNEY 3,517,438

METHOD OF PACKAGING A CIRCUIT MODULE AND JOINING SAME TO A CIRCUIT SUBSTRATE

Alfred H. Johnson and William R. McConnell, Poughkeepsie, N.Y., assignors to International Business Machines Corporation, Armonk, N.Y., a corporation of New York Filed May 12, 1966, Ser. No. 549,544
Int. Cl. H05k *3/30*
U.S. Cl. 29—627 5 Claims

ABSTRACT OF THE DISCLOSURE

Plural integrated circuit modules or "flat packs" are sandwiched and sealed betweed plastic sheets. One of the sheets has receiving slots to locate the modules and each slot is of such a width to allow each module to be supported by the leads which extend in opposite directions beyond the edge of the slot. In the sealed condition the modules can be tested and/or stored. Then the sealed flat packs are separated; the leads exposed, formed, and looped; and the looped leads soldered to circuit substrates.

This invention relates to the packaging of integrated circuit modules or similar electronic components after manufacture to facilitate handling and testing of the modules and assembly to printed circuit cards. The invention is especially applicable to integrated circuit modules commonly known as "flat packs" wherein the leads extend outwardly from the relatively flat main body of the module and lie approximately in the same plane. Such flat pack modules are small and fragile and have a large number of closely spaced flexible leads, and thus are difficult to handle and to test and to assemble to printed circuits cards.

An object of this invention is to provide for the improved, more convenient and less expensive handling of integrated circuit flat pack modules or similar electronic components.

Another object is the provision of new and improved packaging of integrated circuit flat pack modules after manufacture to facilitate testing of the modules and assembly to printed circuit cards.

Yet another object is to provide a new and improved method of mounting integrated circuit flat pack modules on a printed circuit card whereby, when on the card, the leads remain generally covered with dielectric material.

Still another object is the provision of the new and improved continuous process for packaging integrated circuit modules or similar components having leads in the same plane for further handling, testing and assembly operations.

In accordance with the invention, the integrated circuit flat pack modules or similar components are packaged in a continuous process wherein the leads are lamiated between two carrier strips of thermoplastic film material which have previously been provided with registering clearance holes to receive the flat pack main body or case. The composite carrier strip containing the modules then passes to a testing area where pointed probes press through the plastic strip to contact the leads, and in the event of rejection the rejected modules is cut bodily out of the carrier strip at the next station. The carrier strip containing packaged good modules can now be rolled up, with packing material if desired, for storage. To assemble the packaged flat pack modules to a printed circuit card, it is cut out of the carrier strip and the leads are formed free of the thermoplastic material to provide a small contact loop or projection in each lead, the contact loops is the different leads preferably being staggered. As a result of staggering the leads, there is an increase by the same factor in the grid spacing of the printed circuit lands on which the modules are mounted. The modules are secured to the card as for instance by solder reflow. The thermoplastic insulation remains on the module leads even after assembly to the circuit card.

The foregoing and other objects, features and advantages of the invention will be apparent from the following more particular description of a preferred embodiment of the invention, as illustrated in the accompanying drawing wherein:

FIG. 1 is a perspective view of an integrated circuit flat pack module as received from the manufacturer showing in dotted lines a portion cut off when trimming the leads;

FIGS. 2*a* and 2*b* are perspective views of a continuous process for packaging the modules in a carrier strip, and for testing the modules and removing rejected modules from the carrier strip;

Figures 1, 2A, 2B, 3, 4, 5, 6:
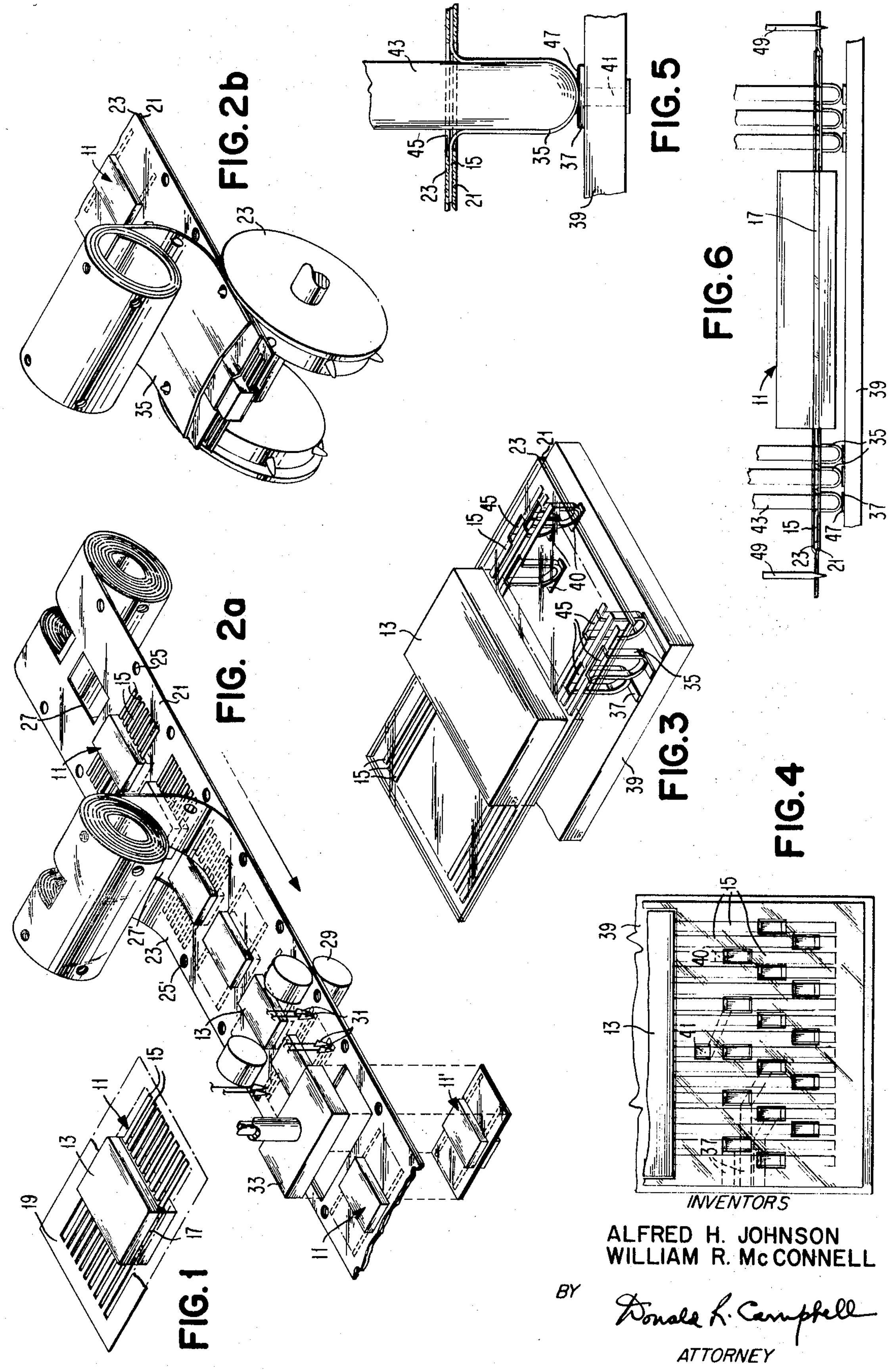
FIG. 3 is perspective view of a packaged module showing at the left the covered leads as cut from the carrier strip, and at the right the leads formed with staggered contact loops or projections for attachment to a printed circuit card.
FIG. 4 is a plan view of a portion of a mounted module further illustrating the staggered contact loops in the leads.
FIG. 5 is a partial side view of an apparatus for forming a contact loop in a lead and attaching the loop to a circuit card.
FIG. 6 is a partial diagrammatic side view of an illustratory complete apparatus for cutting a packaged module from a carrier strip and mounting it on a printed circuit card.

The integrated circuit module 11 shown in FIG. 1 is commonly called a "flat pack" and comprises a main body or case 13 containing the integrated circuit and a plurality of leads 15 extending outwardly from the main body and lying in approximately the same plane. A particular form of integrated circuit flat pack will be described, although it is to be understood that the invention is not limited to this particular flat pack or indeed to an integrated circuit flat pack of any type, since it is applicable to other types of electronic components, such as transistor configurations, which are packaged as a relatively flat main body containing the device from which extend outwardly in at least two opposing directions a plurality of leads lying in the same plane.

More specifically, the integrated circuit flat pack 11 has a main body in the form of a metallic two-part rectangular case 13 joined by a hermetic seal 17 through which the leads 15 extend parallel to one another. The monolithic integrated circuit within the case 13 is typically contained on a planar substrate having lands at either side to which the ends of the leads 15 are connected. The hermetic seal 17 frequently is made of glass, in which case the leads 15 are made of the alloy Kovar (a trademark of the Westinghouse Electric Corp.) which has a coefficient of expansion about the same as that of glass. For convenience of manufacture, the leads 15 have an integral surrounding border 19 which is trimmed off, as shown in dotted lines, before subsequent processing.

The flat pack 11 as shown has 18 leads, nine on each of two opposing sides of the case 13, however it is more common to have a 32-lead flat pack, 16 leads on either side, or a 14-lead or a 10-lead device. For the 32-lead flat pack, the leads 15 are typically spaced .025" from one another and the case 13 is about ½" long.

In accordance with the invention, the relatively small and fragile integrated circuit flat pack modules 11 are packaged between two strips of thermoplastic film material to facilitate handling and testing, storage if desired, and final assembly to printed circuit cards. Referring to FIGS. 2*a* and 2*b*, the lower thermoplastic strip 21 unrolls from a roll and is continuously or intermittently driven forward in a linear path, powered for instance by sprocket drive 23. The strip 21 has sprocket holes 25 at either side for drive and registration purposes and is provided down the center with a row of pre-punched clearance holes 27 to receive the cases of the modules 13. When the cases are inserted into the clearance holes 27, the leads 15 extend out over the thermoplastic film 21 and support the flat pack. The upper thermoplastic strip 23 has similar clearance holes 27' down the center and, at either side, drive and registration holes 25'. The upper thermoplastic strip 23 is rolled down upon the lower strip 21, covering the leads 15.

The layup next passes between two pairs of heated rolls 29 which laminate the edges of the superimposed strips 21 and 23 to one another. The bond between the plastic strips is firm, but the bond between the thermoplastic and the leads 15 is somewhat less firm. At this point the integrated circuit flat packs 11 are securely packaged between the two continuous strips 21 and 23 of the thermoplastic material, with the flat pack cases 13 in the clearance holes 27, 27' and extending above and below. The individual thermoplastic strips 21 and 23 may be made of polyethylene, for instance, or are preferably a pre-laminated Mylar-polyethylene lamination (.001 Mylar polyester, .0005 polyethylene). Mylar is a trademark of E. I. du Pont de Nemours & Co., Inc. for their brand of polyethylene terephthalate. Equivalent thermoplastic materials may be used which heat seal well to one another and which provide good electrical insulation for the leads 15.

At the next station, the flat packs 11 are tested by piercing the plastic lamination with pointed test probes 31 to make contact to the leads 15. As the composite carrier strip bearing the flat packs moves forward, defective modules 11' are punched free from the carrier strip 21, 23 as by cookie-cutter type punch 33, leaving the outside edges of the carrier strip intact. Tested good modules move forward with the carrier strip, and at this point the carrier strip with the packaged good modules can be rolled up onto a spool along with a suitable strip of packing material 35. This will provide a safe method for shipping and storing, if desired, whereby there is no damage to the fragile modules.

To assemble a packaged module to a printed circuit card, the module is cut free of the carrier strip as shown in FIG. 3 wherein the left-hand side of the figure shows the encased leads 15. Before removing the modules from the carrier strip or at the same time, a portion of each lead is formed free of the plastic insulation, see right-hand side of FIG. 3, to provide contact loops or projections 35 for soldering to the printed circuit lines 37 on a printed circuit card 39. The contact loops 35 in the various leads 15 are preferably staggered from one another (see also FIG. 4) to effect an increase in the grid spacing. As shown, the contact loop 35 in every fourth lead is at the same location to provide for an increase in the grid spacing by a factor of three. The printed circuit lines 37 of card 39 have a corresponding increase in their grid spacing. Printed circuit card 39 is any suitable type having an insulating base and adhered conductive printed circuit patterns. Circuit lines 37 may be on both sides of the card 39 and the printed circuit pattern may include lands 40 and through connections from one side to the other such as plated-through holes 41.

A convenient way of forming the contact loops 35 free of the carrier strip insulation is by means of heat punching as for instance by the use of a hot probe 43, FIG. 5. The hot probe 43 is lowered into contact with the composite carrier strip 21, 23 and pushed through, forming a hole 45 in the carrier strip as the contact loop 35 is progressively formed by the continued downward pressure of probe 43. Due to the rather weak bond between the plastic and the leads 15, the end of the lead easily slides within the composite strip 21, 23 as the loop is formed. Desirably, soldering to the printed circuit line 37 takes place at the same time by means of reflow soldering, and for this purpose the circuit line 37 is previously tinned with a coating of solder 47.

Assembly of the integrated circuit modules 11 also can take place in a continuous process. This is illustrated in FIG. 6. A composite carrier strip 21, 23 carrying the packaged modules 11 is moved horizontally in the nature of an endless belt intermittently past an assembly station where the module 11 is aligned with an underlying printed circuit card 39 on which it is to be mounted. At this point, in a substantially simultaneous motion, a bank of hot probes 43, one for each of the leads 15 on each side of the module, is lowered to simultaneously pierce the insulation and form the various contact loops 35, performing reflow soldering at the bottom of the stroke when the contact loops engage the tinned printed circuit lines 37. At about the same time a punch 49 similar to the punch 33 is lowered to cut the module free of the composite strip 21, 23.

By means of the invention, integrated circuit flat pack modules or similarly shaped electronic components can be continuously tested and assembled automatically. An inexpensive method of packaging is provided that prevents damage to the fragile and expensive integrated circuit modules. This method further facilitates handling of the modules for movement between one operation and the next or for storage. Furthermore, the thermoplastic insulation remains on the module lead even after assembly to the printed circuit card or the like and thus provides dielectric coverage for the leads as well as mechanically strengthening the group of leads.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for mounting integrated circuit modules on a printed circuit card having adhered conductive printed circuit patterns, said modules being the type having a relatively flat main body from which leads extend outwardly in at least two opposing directions and lie approximately in the same plane, comprising the steps of providing a composite carrier strip of packaged modules comprising two strips of thermoplastic film material each having a row of pre-cut holes, the two strips being superimposed and laminated to one another with the main body of the modules each inserted into one of the pre-cut holes and the leads thereof extending toward the edges of the composite strip and encased therein, forming a portion of each of the packaged module leads free from the carrier strip to provide a contact loop in each said lead, soldering the contact loops in the leads of at least one of the packaged modules to the conductive printed circuit patterns on the printed circuit card, and cutting the packaged module out of the composite carrier, the portion of the carrier strip covering the leads remaining on the module to provide dielectric coverage.

2. A method as defined in claim 1 wherein the contact loops in the module leads are formed staggered with respect to one another and wherein the conductive printed circuit patterns on the printed circuit card are correspondingly staggered to thereby effect an increase in the grid spacing of the leads.

3. A method for mounting integrated circuit modules on a printed circuit card having adhered conductive printed circuit patterns, said modules being the type having a relatively flat main body from which leads extend outwardly and lie approximately in the same plane, comprising the steps of:

moving a first continuous strip of thermoplastic film material in a substantially linear path, said first strip having a row of pre-cut holes, placing the modules on said first strip with the main body of each of the modules in one of the pre-cut holes and the leads thereof extending toward the edges of the strip, placing a second continuous strip of thermoplastic film material having a row of pre-cut holes over said first strip in register therewith, heat sealing the edges of the aligned thermoplastic strips to provide a composite laminated carrier strip containing the packaged modules, forming a portion of each of the module leads free from the carrier strip to provide a contact loop in each said lead, cutting the packaged modules with formed leads out of the carrier strip, providing a printed circuit card comprising an insulating base having adhered conductive printed circuit patterns, and securing the contact loops in the leads of the packaged modules to the printed circuit patterns on the printed circuit card, the portion of the carrier strip covering the leads remaining on the module to provide dielectric coverage.

4. A method for mounting integrated circuit modules on a printed circuit card having adhered conductive printed circuit patterns, said modules being the type having a relatively flat main body from which leads extend outwardly and lie approximately in the same plane, comprising the steps of:

moving a first continuous of thermoplastic film material in a substantially linear path, said first strip having a row of pre-cut clearance holes, placing the electronic components on said first strip with the main body of each of the components in one of the pre-cut holes and the leads thereof extending toward the edges of the strip, placing a second continuous strip of thermoplastic film material having a row of pre-cut clearance holes over said first strip in register therewith, heat sealing the edges of the aligned thermoplastic strips to provide a composite carrier strip containing a row of the packaged components, testing the components by piercing the carrier strip with pointed probes to contact the leads, thereby identifying defective components, cutting the defective components out of the carrier strip, forming a portion of each of the leads of the remaining components free from the carrier strip to provide a contact loop in each of said leads, cutting the packaged components with formed leads out of the carrier strip, the portions of the carrier strip covering the leads remaining on the components to provide dielectric coverage, providing a printed circuit card comprising an insulating base having adhered conductive circuit patterns tinned with a layer of solder, the aforesaid forming of the contact loops in the leads of the packaged components being performed by projecting hot probes through the carrier strip, the printed circuit card being aligned with one of the packaged components when the leads thereof are formed to simultaneously solder the contact loops by reflow soldering to the tinned printed circuit patterns.

5. The method defined in claim 4 wherein the plurality of said conductive circuit patterns of said card and the plurality of said contact loops are formed in staggered relationship within each plurality to effect an increase in contact spacing.

References Cited

UNITED STATES PATENTS 3,251,927 5/1966 Iovenko ---------- 174—68.5

JOHN P. CAMPBELL, Primary Examiner

R. W. CHURCH, Assistant Examiner

U.S. Cl. X.R.

29—25, 42, 577, 621, 624, 626; 113—119; 174—68; 317—101; 339—17